United States Patent [19]
Opsahl et al.

[11] Patent Number: 6,008,704
[45] Date of Patent: Dec. 28, 1999

[54] FRACTIONAL FREQUENCY SYNTHESIZER WITH MODULATION LINEARIZER

[75] Inventors: Paul L. Opsahl, Cedar Rapids; Dennis J. Hrncirik, Hiawatha, both of Iowa

[73] Assignee: Rockwell Collins, Inc., Cedar Rapids, Iowa

[21] Appl. No.: 09/094,200

[22] Filed: Jun. 9, 1998

[51] Int. Cl.[6] ..................................................... H03C 3/09
[52] U.S. Cl. .......................... 332/127; 455/112; 455/113; 455/119
[58] Field of Search .................................... 332/127, 128; 455/110, 112, 113, 119

[56] References Cited

U.S. PATENT DOCUMENTS

| | | | |
|---|---|---|---|
| 5,055,802 | 10/1991 | Hietala et al. | 332/137 |
| 5,337,024 | 8/1994 | Collins | 332/127 |

*Primary Examiner*—Siegfried H. Grimm
*Attorney, Agent, or Firm*—Kyle Eppele; James P. O'Shaughnessy

[57] ABSTRACT

A method and apparatus are provided for modulating a frequency synthesizer with an adjusted frequency control word determined by adjusting a carrier frequency control word based upon a bit content of a unsigned modulation control word. The method includes the steps of inverting a most significant bit of the unsigned modulation control word to produce an adjusted modulation control word and replicating the inverted most significant bit and appending the replicated bits to a most significant bit side of the adjusted modulation control word to increase a width of the adjusted modulation control word to a width of the carrier frequency control word. The method further includes the step of adjusting the carrier frequency control word by adding the replicated bits and the adjusted modulation control word to corresponding bits of the carrier frequency control word.

34 Claims, 6 Drawing Sheets

6,008,704

FRACTIONAL FREQUENCY SYNTHESIZER WITH MODULATION LINEARIZER

The U.S. Government has a paid-up license in this invention and the right in limited circumstances to require the patent owner to license others on reasonable terms as provided for by the terms of the contract number DAAJ09-91-A004 awarded by the United States Army.

FIELD OF THE INVENTION

The field of the invention relates to frequency synthesizers and more particularly to frequency synthesizers using fractional N techniques.

BACKGROUND OF THE INVENTION

Frequency synthesizers are generally known. As known, a frequency synthesizer is a device which generates an output frequency that is typically an integer multiple of a reference frequency. Such devices have wide application in communication systems in transmitters and receivers as a means for changing a transmitting or receiving channel.

A commonly known frequency synthesizer uses a phase locked loop (PLL), where an output frequency is compared with a reference frequency and the difference used to control the output. A voltage controlled oscillator (VCO) is used to generate the output frequency. A frequency divider is used to divide the output frequency by some integer value. The divided frequency is then compared with a reference frequency in a phase comparator. The output of the phase comparator is scaled, low-pass filtered and applied as a frequency controlling input to the VCO.

Recent innovations have included the development of fractional frequency dividers. The development of fractional frequency dividers has dramatically improved the utility of frequency synthesizers. In the past, a PLL frequency synthesizer could only reach frequencies that were an integer multiple of the reference frequency. The development of a fractional divider now means that virtually any frequency can be provided by any PLL frequency synthesizer using a fractional divider.

While the name "fractional frequency divider" suggests division by some fractional value, the actual division is fractional only in terms of an average value. To accomplish fractional frequency division, a divisor within the fractional frequency divider is incrementally changed over the course of a timing interval in such a way as to correct for the fractional differences caused by integer division.

In practice, a fractional frequency divider includes an integer divider, a summer and a delta-sigma converter. The divider divides an incoming frequency based upon some fractional control number N.F. The fractional control number is in turn made up of an integer portion N and a fractional portion F. The delta-sigma converter receives the fractional portion as an input and provides a series of integer valued corrections as an output. The integer valued corrections are summed with the integer portion in the summer and the result used as the divisor for fractional frequency division.

The output of the fractional frequency divider is then compared with a reference frequency in a phase comparator. Any phase difference detected in the phase comparator is scaled and low-pass filtered. The scaled, low-pass filtered difference signal may then be applied to a VCO to achieve the desired synthesized frequency.

While frequency synthesizers using fractional frequency dividers in the feedback path are effective, there are many situations where feedforward control would have great utility. Accordingly a need exists for a method of imposing feedforward control on a frequency synthesizer using fractional frequency division.

SUMMARY

A method and apparatus are provided for modulating a frequency synthesizer with an adjusted frequency control word determined by adjusting a carrier frequency control word based upon a bit content of a unsigned modulation control word. The method includes the steps of inverting a most significant bit of the unsigned modulation control word to produce an adjusted modulation control word and replicating the inverted most significant bit and appending the replicated bits to a most significant bit side of the adjusted modulation control word to increase a width of the adjusted modulation control word to a width of the carrier frequency control word. The method further includes the step of adjusting the carrier frequency control word by adding the replicated bits and the adjusted modulation control word to corresponding bits of the carrier frequency control word.

DETAILED DESCRIPTION OF A PREFERRED EMBODIMENT

Figure 1:
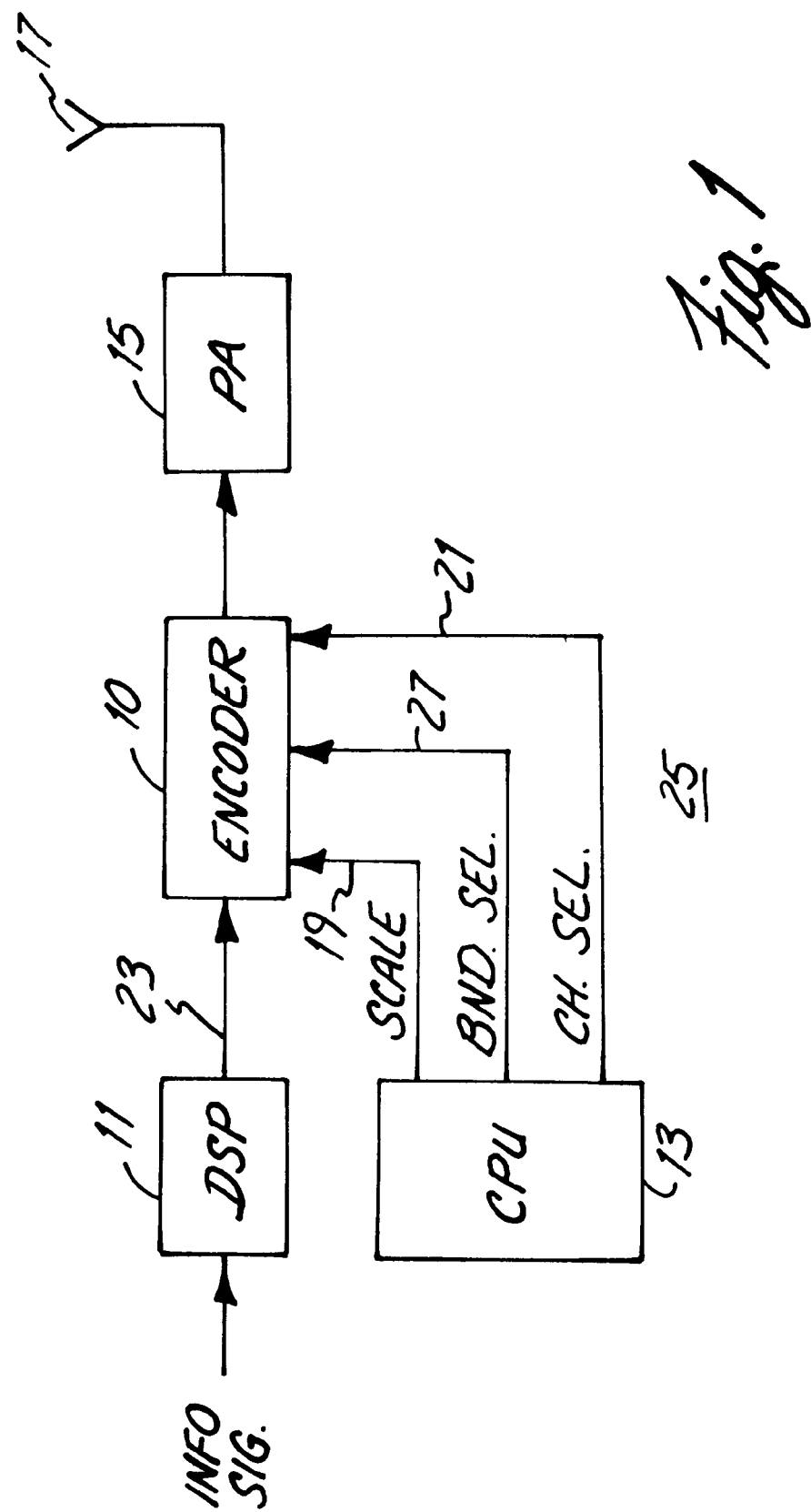
FIG. 1 is a block diagram of a fractional frequency synthesizer with linearized modulation in accordance with an embodiment of the invention.

FIG. 1 is a block diagram of a radio transmitter 25 in accordance with an embodiment of the invention. Within the radio transmitter 25, an information signal (e.g., analog voice, digital data, etc.) is received by a DSP 11 (e.g., from a microphone, another DSP, etc.) and processed into an appropriate format (e.g., a digital word stream) and applied to an encoder 10. Within the encoder 10, the word stream is encoded into a radio frequency signal under an appropriate format (e.g., frequency modulation, phase modulation, etc.), amplified in an appropriate power amplifier 15 and transmitted through an antenna 17.

Figure 2:
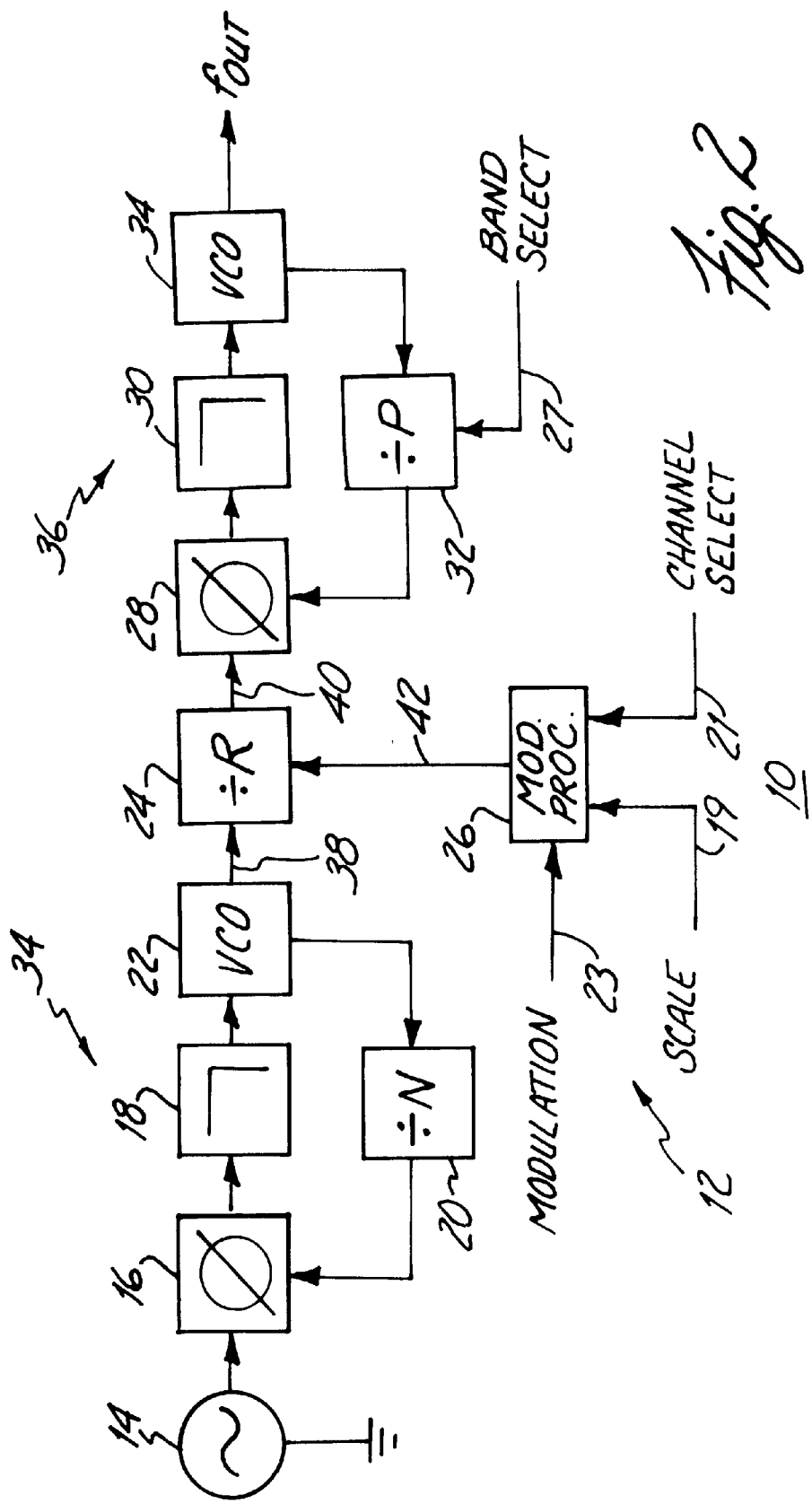
FIG. 2 is a block diagram of the encoder of FIG. 1.

FIG. 2 is a block diagram of the encoder 10. Contained within the encoder 10 is a first phase locked loop (PLL) 34 and a second PLL 36 separated by a modulating divider 24. Under the embodiment, the modulating divider 24 modulates an input frequency from the first phase locked loop 34 by dividing the input frequency by a modulated divisor. The modulated divisor is not only modulated with an information signal, but also with an appropriate channel selection number.

The second phase locked loop 36 shifts the modulated signal to an appropriate final transmission frequency. The second phase locked loop 36 is also provided with a programmable divider 32 wherein a frequency band of transmission may be selected by entry of an appropriate divider P.

The first and second PLLs 34, 36 may be any of a number of prior art synthesizers. They may be either synthesizers using integer dividers or fractional frequency dividers.

The first phase locked loop 34 may be constructed to provide an output 38 at a relatively constant frequency within the L-band (e.g., 1310.72 MHZ). Within the modulating divider 24, the constant frequency of the first PLL 34 may be divided by a divisor supplied by a modulating processor 26. Through the selection of an appropriate divisor range (e.g., 102–204), a modulated signal at an output 40 of the modulating divisor 24 may be caused to span an appropriate frequency range (e.g., 6–13 MHZ).

Within the second phase locked loop 36, the modulated signal may be frequency-shifted to a final transmission frequency. For example, any channel within the high frequency (HF) band (i.e., 30–88 MHZ) may be selected by entry of an appropriate band select number P through a programming input 27. A band select input number of "4" would provide a modulated output $f_{out}$ in the range of from 30 to 51.2 MHZ. A band select input number of "8" would provide a modulated output $f_{out}$ in the range of from 51.2 to 88 MHZ.

Similarly, other transmission bands may be selected with other band select numbers. For instance, a band select number of "16" may be used to synthesize signals in the very high frequency (VHF) band (i.e., 116–152 MHZ). Channels in the ultra high frequency (UHF) band (i.e., 225–400 MHZ) may be selected with a band select number of "32".

Fractional frequency resolution may be achieved within the modulation processor 26 of this system 10 by using a delta-sigma modulator to control the divisor of the modulating divider 24. The use of a delta-sigma modulator inherently allows the system 10 to encode a signal using either frequency or phase modulation. Also, since the modulation deviation and the quantization noise are referenced to the L-band frequency supplied from the first phase locked loop 34, the modulation divider 24 provides the additional benefit of reducing the modulation deviation at the phase-detector 28 of the second PLL loop 36. Such reduction in deviation contributes to the reduction in noise at the output of the second PLL 36.

One difficulty in implementing the modulation system 10 relates to the weighting of the modulation signal 23. For example, the channel select signal 21 may be a 34 bit control signal while the modulation signal may be a series of 10 bit words. The channel select signal 21 must be of sufficient range to access any selected channel from the lowest to the highest frequency within a band. The modulation signal 23, in contrast, is only large enough to correctly modulate a single channel. The problem is that the modulation signal 23 must be scaled to cause the same modulation on a high frequency channel of a band as it does on a low frequency channel of a band.

To scale the modulation signal 23, a scaling value may be calculated for each channel selected. To develop a general equation for the scaling value, a constant "K" is first defined as a value that may be used for channel selection. K may be defined by the equality, $K=2^{24}(f_{in}/f_{out})$, where $f_{in}$ is the input 38 to the modulating divider 24 and $f_{out}$ is a selected channel at an output of the modulating divider 24. K, in effect, may be considered as a programming number that may be used to program a center frequency of a frequency band to be accessed by the system 10.

To provide a correct level of deviation for all channel selection numbers K, expressions may be developed which relate the peak dynamic amplitude, $M_{pk}$, of the modulation signal 23 and the desired level of modulation deviation, $\Delta f$, to the scaling value 19. The equality $S=\Delta k/M_{pk}$, where $\Delta k=-K(\Delta f/(f_{out}+\Delta f))$ has been found to provide good results.

Another difficulty exists in modulating frequency synthesizers with unsigned information signals. As is known, some information signals (e.g., PCM) are generated and processed as unsigned quantities. As such, an unsigned information signal has an inherent DC offset which must be accommodated by the signal processing system 10.

Figure 3:
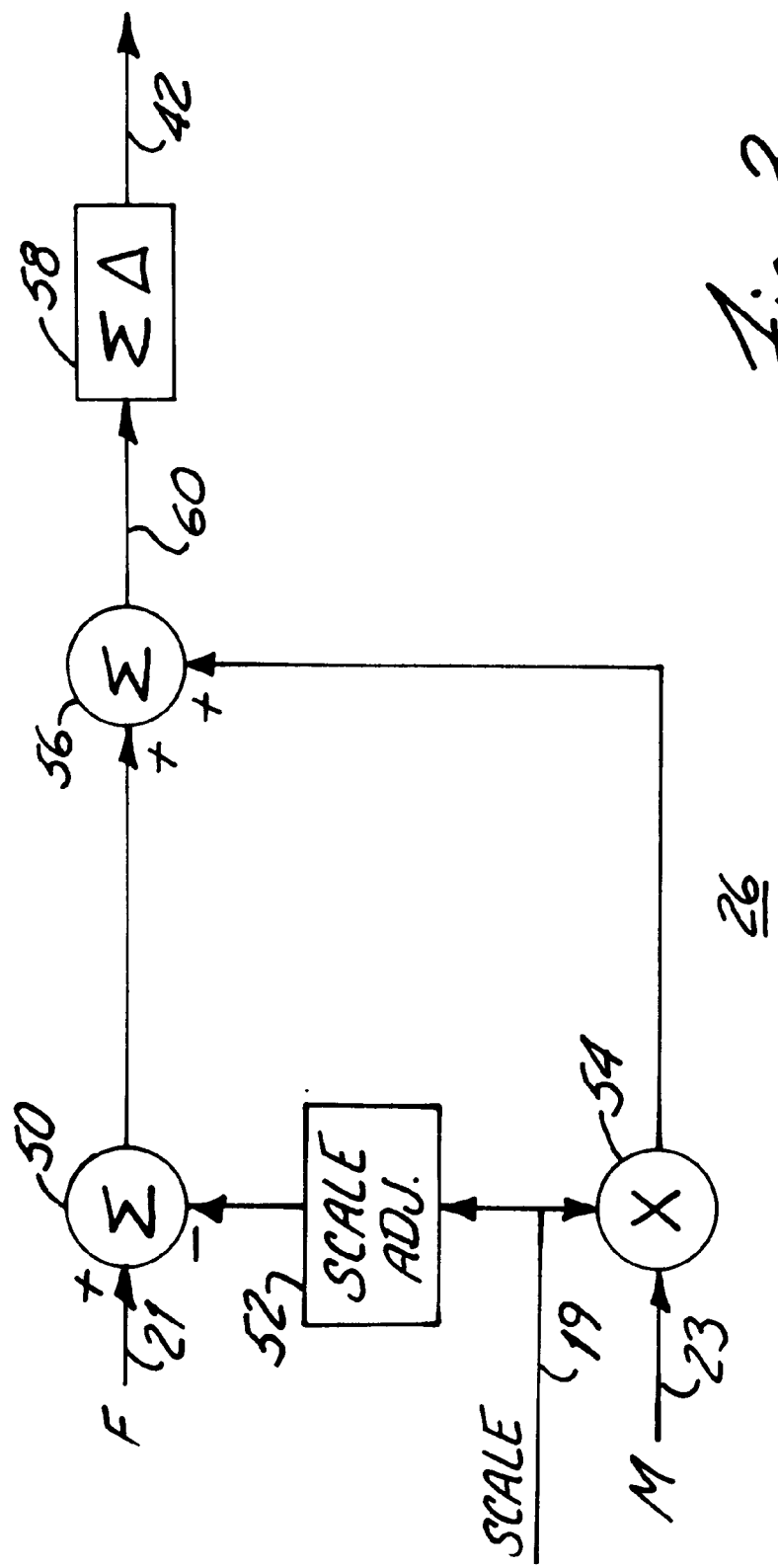
FIG. 3 is a block diagram of the modulation processor of FIG. 2.

FIG. 3 is a block diagram of the modulation processor 26 of FIG. 2. As shown, the scale value from the scaling input 19 is further adjusted in a scaling adjuster 52 and subtracted from the frequency select signal received on frequency select input 21. Scale adjusting which occurs in the scaling adjuster 52 may include loading the 10 bit scaling value into a shift register and shifting the 10 bits left by nine bits. Alternately, the 10 bits of the scaling value may be multiplied by a value equal to two to an exponent equal to the position number of the bit location (i.e., 9) of the most significant bit (MSB) of the modulation value.

In addition, the modulation signal 23 is multiplied by the scale value 19 in a multiplier 54. The product of the modulation signal and the scale value is summed in the adder 56 with the difference of the frequency select signal and the adjusted scale value.

Since the MSB of the modulation signal ($m_9$) represents the static offset in the unsigned modulation signal, it must be removed either before or after the multiplied modulation signal is added to the frequency control signal in the adder 56. In addition, since the modulation control signal 23 is multiplied by the scaling signal 19, the static offset must also be scaled. The static offset may be scaled by shifting the scaling value to the left by nine bits or multiplying by $2^9$. When the scaling value bits ($S_9$-$S_0$) are subtracted from the frequency select bits ($f_{33}$-$f_0$), the bits are aligned as follows.

| $f_{33}$ | $f_{32}$ | $f_{31}$ | ... | $f_{19}$ | $f_{18}$ | $f_{17}$ | ... | $f_{10}$ | $f_9$ | $f_8$ | ... | $f_1$ | $f_0$ |
|---|---|---|---|---|---|---|---|---|---|---|---|---|---|
| 0 | 0 | 0 | ... | 0 | $S_9$ | $S_8$ | ... | $S_1$ | $S_0$ | 0 | ... | 0 | 0 |

The sum F' may be represented by the equality $F'=F-(S)(2_9)$.

Next, the scaling signal and the modulation signals are multiplied. Expressing the modulation signal as the sum of the MSB and bits $m_8$-$m_0$, and using the distributive property associated with bit location, $$(S)(M)=(S)(m_9)(2^9)+(S)(m_8 \ldots m_0).$$

The second adder 56 combines the scaled modulation signal (S)(M) and F' to provide a divide control signal C on the output 60. By combining and rearranging terms, an expression for C may be obtained as follows.

$$C=F+(S)(m_8 \ldots m_0)+(S)(2^9)(m_9\text{-}1).$$

Rearranging further, C may be expressed in either of two forms depending upon whether $m_9$ is one or zero as follows.

$$C=F+(S)\{+(0)(2^9)+m_8 \ldots m_0)\}, \text{ when MSB}(m_9)=1 \text{ and}$$

$$C=F+(S)\{-(1)(2^9)+m_8 \ldots m_0)\}, \text{ when MSB}(m_9)=0.$$

Stated differently, C is equal to the frequency control signal plus the value of scaled modulation bits 8-0 when the MSB of the modulation signal is equal to one. Alternatively, C is equal to the frequency control signal plus the value of the scaled modulation bits 8-0 minus the value of the scaled MSB when the MSB of the modulation signal is equal to zero.

Table 1 provides a practical representation of an alternate method of practicing an illustrated embodiment of the invention. Column 1 is a decimal representation of an unsigned number centered around the value 128. Column 2 is an 8-bit (modulo 256) representation of the unsigned number in column 1.

TABLE 1

| 1 | 2 | 3 | 4 | 5 | 6 |
|---|---|---|---|---|---|
| 0 | 00000000 | 10000000 | −128 | 1111111110000000 | −128 |
| 1 | 00000001 | 10000001 | −127 | 1111111110000001 | −127 |
| 2 | 00000010 | 10000010 | −126 | 1111111110000010 | −126 |
| 3 | 00000011 | 10000011 | −125 | 1111111110000011 | −125 |
| 4 | 00000100 | 10000100 | −124 | 1111111110000100 | −124 |
| . | . | . | . | | |
| . | . | . | . | | |
| . | . | . | . | | |
| 126 | 01111110 | 11111110 | −2 | 1111111111111110 | −2 |
| 127 | 01111111 | 11111111 | −1 | 1111111111111111 | −1 |
| 128 | 10000000 | 00000000 | 0 | 0000000000000000 | 0 |
| 129 | 10000001 | 00000001 | 1 | 0000000000000001 | 1 |
| 130 | 10000010 | 00000010 | 2 | 0000000000000010 | 2 |
| . | . | . | . | | |
| . | . | . | . | | |
| . | . | . | . | | |
| 251 | 11111011 | 01111011 | 123 | 0000000001111011 | 123 |
| 252 | 11111100 | 01111100 | 124 | 0000000001111100 | 124 |
| 253 | 11111101 | 01111101 | 125 | 0000000001111101 | 125 |
| 254 | 11111110 | 01111110 | 126 | 0000000001111110 | 126 |
| 255 | 11111111 | 01111111 | 127 | 0000000001111111 | 127 |

To convert the unsigned value of column 2 into a signed value, the MSB (bit 8) is inverted as shown in column 3 to produce an adjusted modulation control word. The inverted MSB may be regarded as a negative component of the adjusted modulation control word while a set of remaining bits (bits 7-0) may be regarded as a position component. The negative MSB and remaining bits may then be summed to produce the decimal result shown in column 4.

To add the adjusted modulation control word to the carrier frequency control word, the inverted MSB may be extended to match a length (i.e., number of bits) of the carrier frequency control word. More specifically, the inverted MSB of the adjusted modulation control word is replicated and the replicated bits are appended to a most significant bit side of the adjusted modulation control word as shown in column 5. The bits of the extended, adjusted modulation control word may then be added to corresponding bits of the carrier frequency control word.

Figure 4:
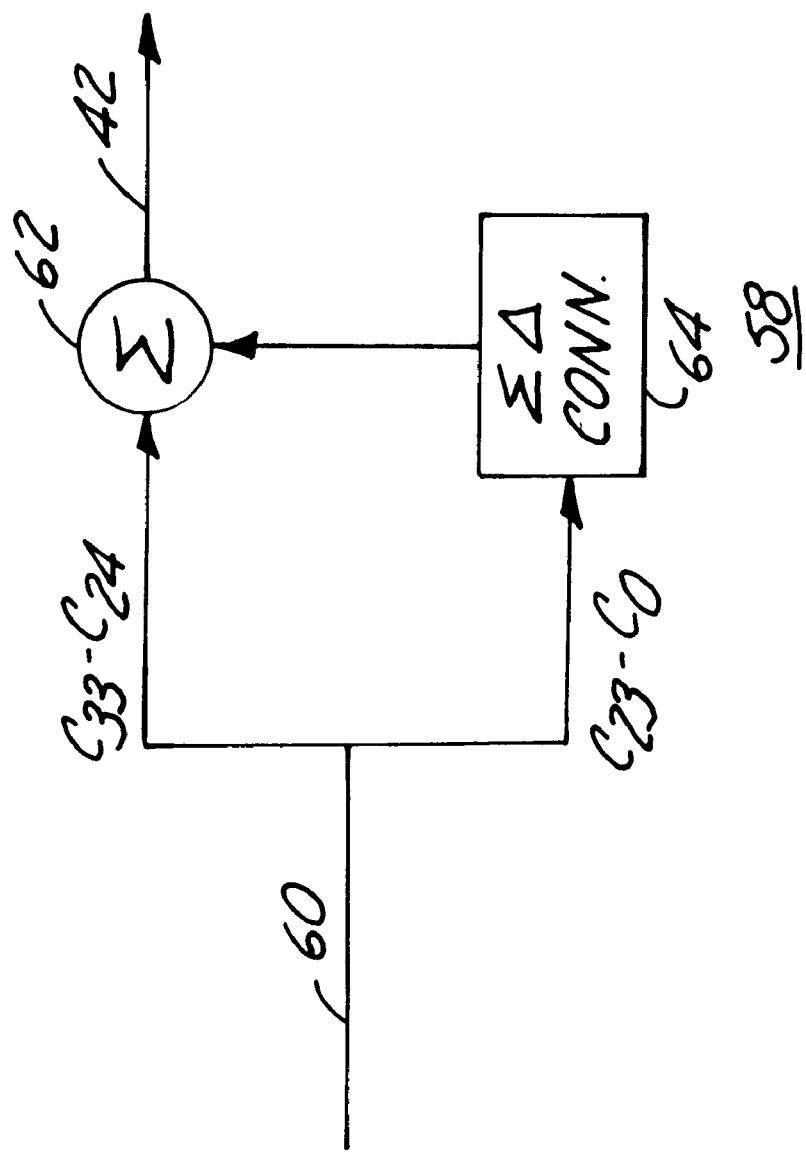
FIG. 4 is a block diagram of the delta-sigma modulator of FIG. 3.

FIG. 4 is a block diagram of the delta-sigma modulator 58. Within the delta-sigma modulator 58 an integer portion (e.g., the upper ten bits, $c_{33}$-$c_{24}$) of the control number C is separated from a fractional portion $c_{23}$-$c_0$. The fractional portion is applied as an input to a delta-sigma converter 64. The output of the delta-sigma converter 64 represents an error correcting value which is used to adjust the divisor applied to the divider 24. Under the embodiment, the error correcting value is added to the integer portion of the frequency control number in an adder 62. The sum is used as the divisor for frequency division within the divider 24 to accomplish modulation.

Figure 5:
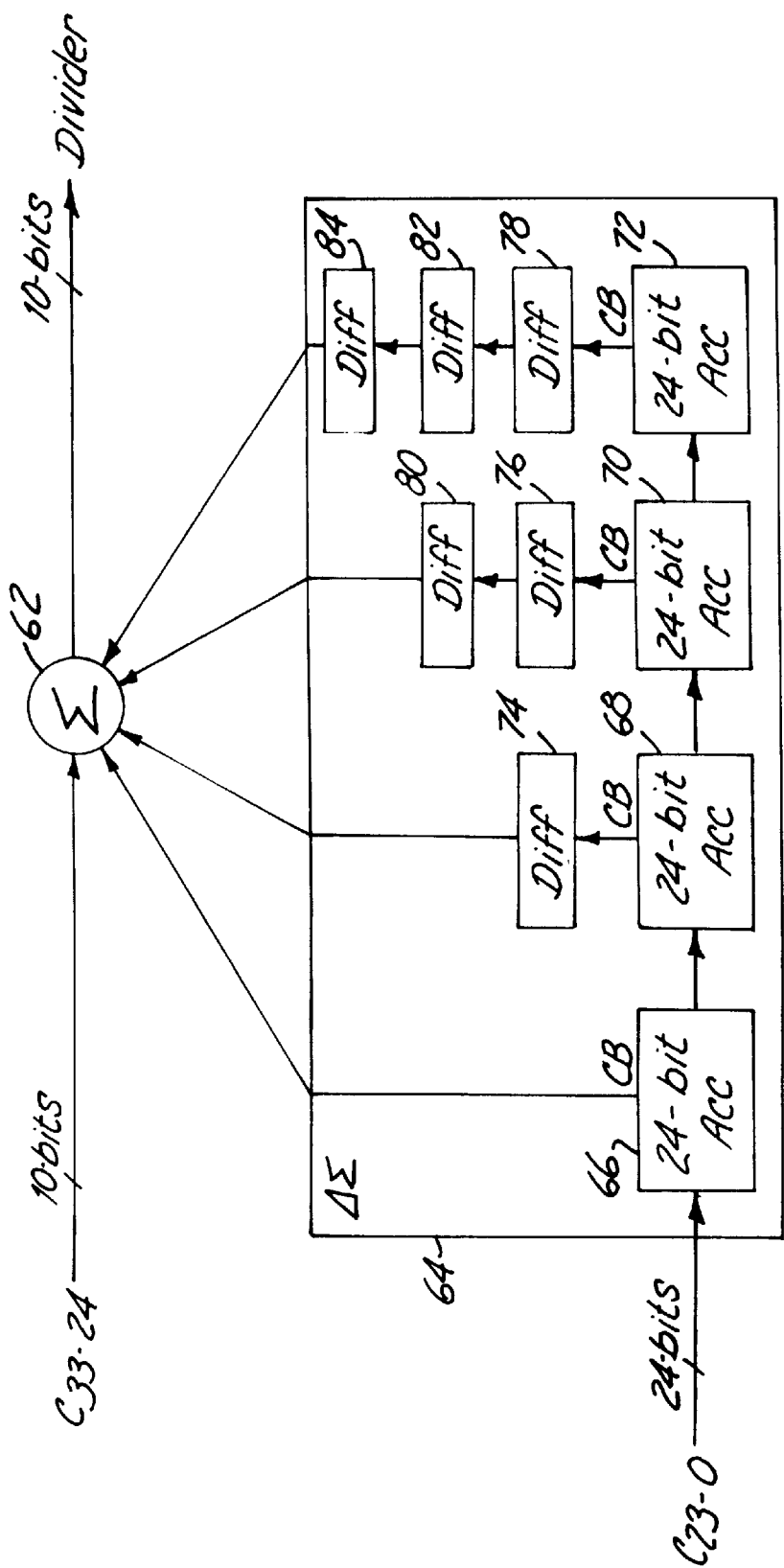
FIG. 5 is a block diagram of the delta-sigma converter and summer of FIG. 4.

FIG. 5 is a block diagram of the delta-sigma converter 64 under an illustrated embodiment of the invention. For a 24 bit fractional portion, four 24-bit accumulators 66, 68, 70, 72 are used for fourth order delta-sigma modulation.

For the first accumulator 66, the carry bit (CB) is added directly to the integer portion within the adder 62. For each subsequent accumulator 68, 70, 72, the carry bit is incrementally differentiated within differentiators 74, 76, 78, 80, 82, 84 of the MASH structure shown. The differentiated carry bits of each subsequent accumulator 68, 70, 72 are added along with the carry bit of the first accumulator 66 to provide the error correcting value for the next calculation cycle.

Figure 6:
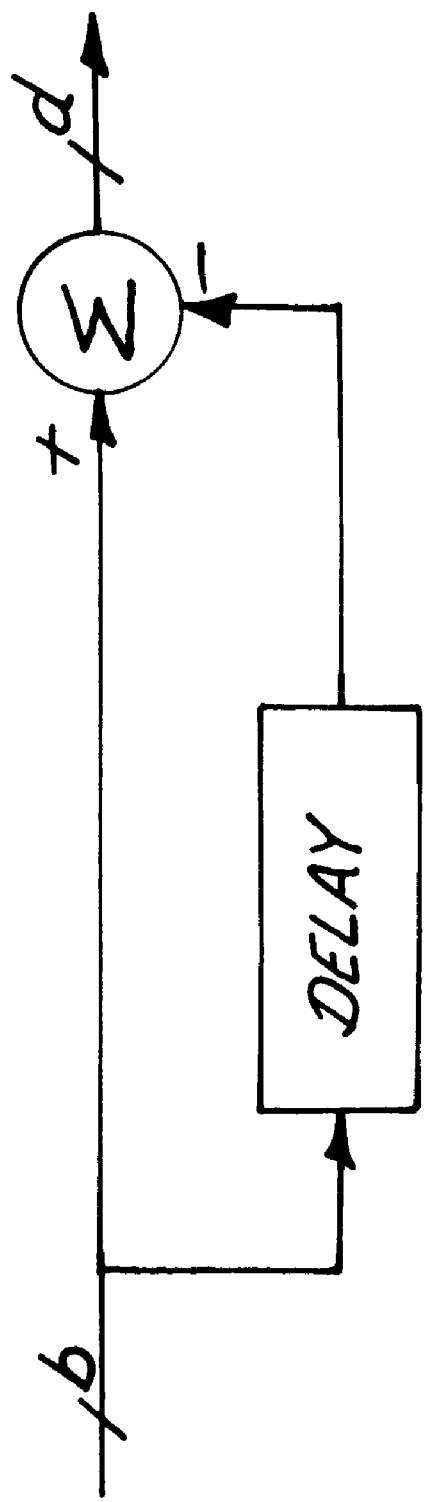
FIG. 6 is a block diagram of the differentiator of FIG. 5.

FIG. 6 is a block diagram of a specific implementation of the differentiators 74, 76, 78, 80, 82, 84. As shown for a constant input, the output remains zero. For a varying input signal, the output signal amplitude is equal to the amplitude differences of successive input samples. The number of bits going in (b) and bits coming out (d) depend on the signal characteristics.

The use of the system 10 allows direct modulation of an information signal onto a reference signal without the use of complicated mixing, filtering or amplification circuits. Further, the use of a programmable PLL 36 on the output of the direct modulation divider allows a number of frequency bands to be accessed, again, without complicated mixing, filtering or amplification circuits.

Specific embodiments of methods and apparatus of providing fractional frequency synthesis with linearized modulation according to the present invention has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention, any and all modifications, variations, or equivalents that fall within the true spirit and scope of the basic underlying principles disclosed and claimed herein.

We claim:

1. A method of modulating a frequency synthesizer with an adjusted frequency control word determined by adjusting a carrier frequency control word based upon a bit content of a unsigned modulation control word, such method comprising the steps of:

inverting a most significant bit of the unsigned modulation control word to produce an adjusted modulation control word;

replicating the inverted most significant bit and appending the replicated bits to a most significant bit side of the adjusted modulation control word to increase a width of the adjusted modulation control word to a width of the carrier frequency control word; and, adjusting the carrier frequency control word by adding the replicated bits and the adjusted modulation control word to corresponding bits of the carrier frequency control word.

2. The method of modulating a frequency synthesizer as in claim 1 wherein the step of inverting and replicating bits further comprises separating a most significant bit from a set of remaining bits of the unsigned modulation control word.

3. The method of modulating a frequency synthesizer as in claim 2 wherein the step of adjusting the carrier frequency control word further comprises adding the remaining bits to corresponding bits of the carrier frequency control word when the most significant bit is one.

4. The method of modulating a frequency synthesizer as in claim 3 wherein the step of adjusting the carrier frequency control word further comprises subtracting an inverted bit value of the most significant bit from the sum of the remaining bits and the carrier frequency control word, when the most significant bit is zero.

5. The method of modulating a frequency synthesizer as in claim 4 further comprising scaling the remaining bits by a scaling factor.

6. The method of modulating a frequency synthesizer as in claim 5 wherein the step of scaling the remaining bits further comprises multiplying the remaining bits by a scaling factor.

7. The method of modulating a frequency synthesizer as in claim 6 further comprising bit shifting the scaling factor by multiplying the scaling factor by a value equal to two to the bit power of the most significant bit.

8. The method of modulating a frequency synthesizer as in claim 7 further comprising summing the bit shifted scaling factor with the carrier frequency control word.

9. The method of modulating a frequency synthesizer as in claim 8 further comprising summing the bit shifted scaling factor, carrier frequency control word and multiplied remaining bits and scaling factor.

10. The method of modulating a frequency synthesizer as in claim 1 further comprising calculating the frequency control word based upon a reference frequency.

11. The method of modulating a frequency synthesizer as in claim 10 further comprising calculating the scaling factor based upon the frequency control word.

12. The method of modulating a frequency synthesizer as in claim 11 further comprising calculating the scaling factor as a percentage of the frequency control word.

13. Aparatus for modulating a frequency synthesizer with an adjusted frequency control word determined by adjusting a carrier frequency control word based upon a bit content of a unsigned modulation control word, such apparatus comprising:

means for inverting a most significant bit of the unsigned modulation control word to produce an adjusted modulation control word;

means for replicating the inverted most significant bit and appending the replicated bits to a most significant bit side of the adjusted modulation control word to increase a width of the adjusted modulation control word to a width of the carrier frequency control word; and, means for adjusting the carrier frequency control word by adding the replicated bits and the adjusted modulation control word to corresponding bits of the carrier frequency control word.

14. The apparatus for modulating a frequency synthesizer as in claim 13 wherein the means for inverting and replicating bits further comprises means for separating a most significant bit from a set of remaining bits of the unsigned modulation control word.

15. The apparatus for modulating a frequency synthesizer as in claim 14 wherein the means for adjusting the carrier frequency control word further comprises means for adding the remaining bits to corresponding bits of the carrier frequency control word when the most significant bit is one.

16. The apparatus for modulating a frequency synthesizer as in claim 15 wherein the means for adjusting the carrier frequency control word further comprises means for subtracting an inverted bit value of the most significant bit from the sum of the remaining bits and the carrier frequency control word, when the most significant bit is zero.

17. The apparatus for modulating a frequency synthesizer as in claim 16 further comprising means for scaling the remaining bits by a scaling factor.

18. The apparatus for modulating a frequency synthesizer as in claim 17 wherein the means for scaling the remaining bits further comprises multiplying the remaining bits by a scaling factor.

19. The apparatus for modulating a frequency synthesizer as in claim 18 further comprising means for bit shifting the scaling factor by multiplying the scaling factor by a value equal to two to the bit power of the most significant bit.

20. The apparatus for modulating a frequency synthesizer as in claim 19 further comprising means for summing the bit shifted scaling factor with the carrier frequency control word.

21. The apparatus for modulating a frequency synthesizer as in claim 20 further comprising means for summing the bit shifted scaling factor, carrier frequency control word and multiplied remaining bits and scaling factor.

22. The apparatus for modulating a frequency synthesizer as in claim 13 further comprising means for calculating the frequency control word based upon a reference frequency.

23. The apparatus for modulating a frequency synthesizer as in claim 22 further comprising means for calculating the scaling factor based upon the frequency control word.

24. The apparatus for modulating a frequency synthesizer as in claim 23 further comprising means for calculating the scaling factor as a percentage of the frequency control word.

25. Apparatus for modulating a frequency synthesizer with an adjusted frequency control word determined by adjusting a carrier frequency control word based upon a bit content of a unsigned modulation control word, such apparatus comprising:

a bit mask which inverts a most significant bit of the unsigned modulation control word to produce an adjusted modulation control word;

shift register which replicates the inverted most significant bit and appends the replicated bits to a most significant bit side of the adjusted modulation control word to increase a width of the adjusted modulation control word to a width of the carrier frequency control word; and, an adder which adjusts the carrier frequency control word by adding the replicated bits and the adjusted modulation control word to corresponding bits of the carrier frequency control word.

26. The apparatus for modulating a frequency synthesizer as in claim 25 wherein the adder which adjusts the carrier frequency control word further comprises a bit analyzer which adds the remaining bits to corresponding bits of the carrier frequency control word when the most significant bit is one.

27. The apparatus for modulating a frequency synthesizer as in claim 26 wherein the adder which adjusts the carrier frequency control word further comprises a subtractor which subtracts an inverted bit value of the most significant bit from the sum of the remaining bits and the carrier frequency control word, when the most significant bit is zero.

28. The apparatus for modulating a frequency synthesizer as in claim 27 further comprising a scaler which scales the remaining bits by a scaling factor.

29. The apparatus for modulating a frequency synthesizer as in claim 28 wherein the scaler which scales the remaining bits further comprises a multiplier which multiplies the remaining bits by a scaling factor.

30. The apparatus for modulating a frequency synthesizer as in claim 29 further comprising a scaling factor bit shift register which bit shifts the scaling factor by multiplying the scaling factor by a value equal to two to the bit power of the most significant bit.

31. The apparatus for modulating a frequency synthesizer as in claim 30 further comprising a scaling factor adder which sums the bit shifted scaling factor with the carrier frequency control word.

32. The apparatus for modulating a frequency synthesizer as in claim 25 further comprising a reference frequency processor which calculates the frequency control word based upon a reference frequency.

33. The apparatus for modulating a frequency synthesizer as in claim 32 further comprising a scaling factor processor which calculates the scaling factor based upon the frequency control word.

34. The apparatus for modulating a frequency synthesizer as in claim 33 further comprising proportion processor which calculates the scaling factor as a percentage of the frequency control word.

* * * * *